US006259573B1

(12) United States Patent
Tsuwako et al.

(10) Patent No.: US 6,259,573 B1
(45) Date of Patent: Jul. 10, 2001

(54) PREAMPLIFIER CIRCUIT WITH MAGNETORESISTIVE SENSOR ESD PROTECTION

(75) Inventors: Kazushi Tsuwako, Machida; Yoshiro Amano, Yokohama; Takao Matsui, Yamato; Tsuyoshi Miura, Fujisawa, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/255,055

(22) Filed: Feb. 22, 1999

(30) Foreign Application Priority Data

Feb. 23, 1998 (JP) .................................................. 10-040255

(51) Int. Cl.$^7$ ........................................................ G11B 5/09
(52) U.S. Cl. .......................... 360/46; 360/67; 360/244.1; 360/323
(58) Field of Search .............................. 360/323, 244.1, 360/245.9, 245.8, 246, 324, 326, 46, 67; 330/207 P, 298; 369/72, 73, 74; 327/553, 558, 532

(56) References Cited

U.S. PATENT DOCUMENTS 5,375,022 * 12/1994 Gill et al. ............................. 360/323
5,748,412 * 5/1998 Murdock et al. .................... 360/323

FOREIGN PATENT DOCUMENTS 7-169005   7/1995 (JP) .
8-45033    2/1996 (JP) .

* cited by examiner

Primary Examiner—Alan T. Faber
(74) Attorney, Agent, or Firm—Randall J. Bluestone; Ron Feece

(57) ABSTRACT

A preamplifier circuit to improve the ESD immunity of magnetic recording devices having magnetoresistive (MR) sensors, without degrading the sensor's high-frequency characteristics. The preamplifier circuit is coupled to an MR sensor having one terminal grounded. The preamplifier circuit includes a varistor coupled between a power supply line and a ground terminal. If a high voltage, exceeding the varistor voltage, is applied to the chassis (ground), it is discharged through the varistor between the power supply voltage line and the ground terminal, instead of through the MR head or the arm electronics module. The present invention thereby protects the MR head and the arm electronics module from ESD damage.

14 Claims, 5 Drawing Sheets

PREAMPLIFIER CIRCUIT WITH MAGNETORESISTIVE SENSOR ESD PROTECTION

BACKGROUND OF THE INVENTION

1. Field of the Invention

The present invention relates to a preamplifier circuit, and more particularly to preamplifier circuit that includes electrostatic discharge (ESD) protection for a magnetoresistive sensor.

2. Description of Related Art

The recording density of magnetic disk drive apparatus has increased dramatically, due to recent developments in, for example, micro-fabrication technology and control technology.

Due to the increased recording density, the magnetic domain area per unit of recorded information has been reduced, and the conventional reproducing method, which reproduces a signal by means of electromagnetic induction, using the relative motion between the head gap of a magnetic head and the magnetic domains on the disk surface, is reaching its limits. A reproducing method that employs an MR (magnetoresistive) head using the magnetoresistive effect, and does not rely directly on relative motion between the disk and the head, has therefore recently been developed.

GMR (giant magnetoresistive) heads that exploit the GMR effect have also come into practical use. These MR heads configure the MR element with layers of material such as thin metal films, helping to increase the recording density still further.

In more economical magnetic disk drives, for cost and other reasons, the head is configured to be single-ended, with one end of the MR (or GMR) head grounded to a chassis or the like of the HDD. When used in this single-ended fashion, since one end of the head is grounded to the chassis, if the chassis of the HDD acquires a high potential during assembly, for example, this potential is applied unaltered to the head.

An invention described in Unexamined Japanese Patent Application No. 169005/1995 (reference 1), for example, inserts a variable conductive device in parallel with the head; if a high voltage is applied across the MR head, the voltage is discharged through this protective element to protect the MR head. An invention described in Unexamined Japanese Patent Application No. 45033/1996 (reference 2) provides protective elements such as constant-voltage diodes, varistors, or the like between the layers of MR material constituting the MR head and the magnetic shield layers that are provided to enclose these layers of MR material, from which they are separated by insulating layers. If the voltage of the layers of MR material and the like exceeds a certain voltage, the voltage is discharged through these protective elements, so as to protect the head.

A problem with approaches in references 1 and 2, however, is that since the protective elements are disposed in parallel with the MR head, the MR head's high-frequency response is degraded by the capacitive components of the protective elements.

A further problem with the approach described in reference 2 is that if the size of the head is reduced due to increased recording density, the head becomes difficult to manufacture.

When an MR head is employed, damage to the head caused by electrostatic discharge (ESD) after the magnetic disk drive apparatus is manufactured is a rare occurrence, but when a GMR head, which has a different destruction mode from an MR head, is employed, the head is less immune than an MR head to destruction by ESD.

In view of the foregoing problems and limitations, there is a need for improved ESD protection for magnetoresistive sensors.

SUMMARY OF THE INVENTION

An object of the present invention is therefore to improve the ESD immunity of an apparatus employing a magnetoresistive sensor, without degrading its high-frequency response.

To overcome the above problems, a preamplifier circuit according to the present invention comprises an amplifier circuit for amplifying an output signal of a magnetoresistive sensor (which may be a giant magnetoresistive sensor) that is grounded at one end, and a nonlinear conductive element coupled between a ground terminal and a power supply voltage line that supplies a power supply voltage to the amplifier circuit.

A printed circuit according to the present invention comprises an amplifier circuit for amplifying an output signal detected from a magnetoresistive sensor that is grounded at one end, a power supply line for supplying a power supply voltage to the amplifier circuit, and a nonlinear conductive element coupled between a ground terminal and the power supply voltage line.

A flexible cable according to the present invention comprises an amplifier circuit for amplifying an output signal detected from a magnetoresistive sensor that is grounded at one end, a power supply line for supplying a power supply voltage to the amplifier circuit, and a nonlinear conductive element coupled between a ground terminal and a power supply voltage line.

A magnetic recording apparatus according to the present invention comprises a disk-shaped recording medium, a head having a magnetoresistive sensor that is grounded at one end, an amplifier circuit to amplify an output signal detected from the magnetoresistive sensor, a power supply voltage line for supplying a power supply voltage to the amplifier circuit, a nonlinear conductive element coupled between a ground terminal and the power supply voltage line to discharge voltages greater than a predetermined magnitude, and a data reproducing circuit for reproducing data from the magnetoresistive sensor output signal amplified by the amplifier circuit.

DETAILED DESCRIPTION OF THE PREFERRED EMBODIMENT

Figure 1:
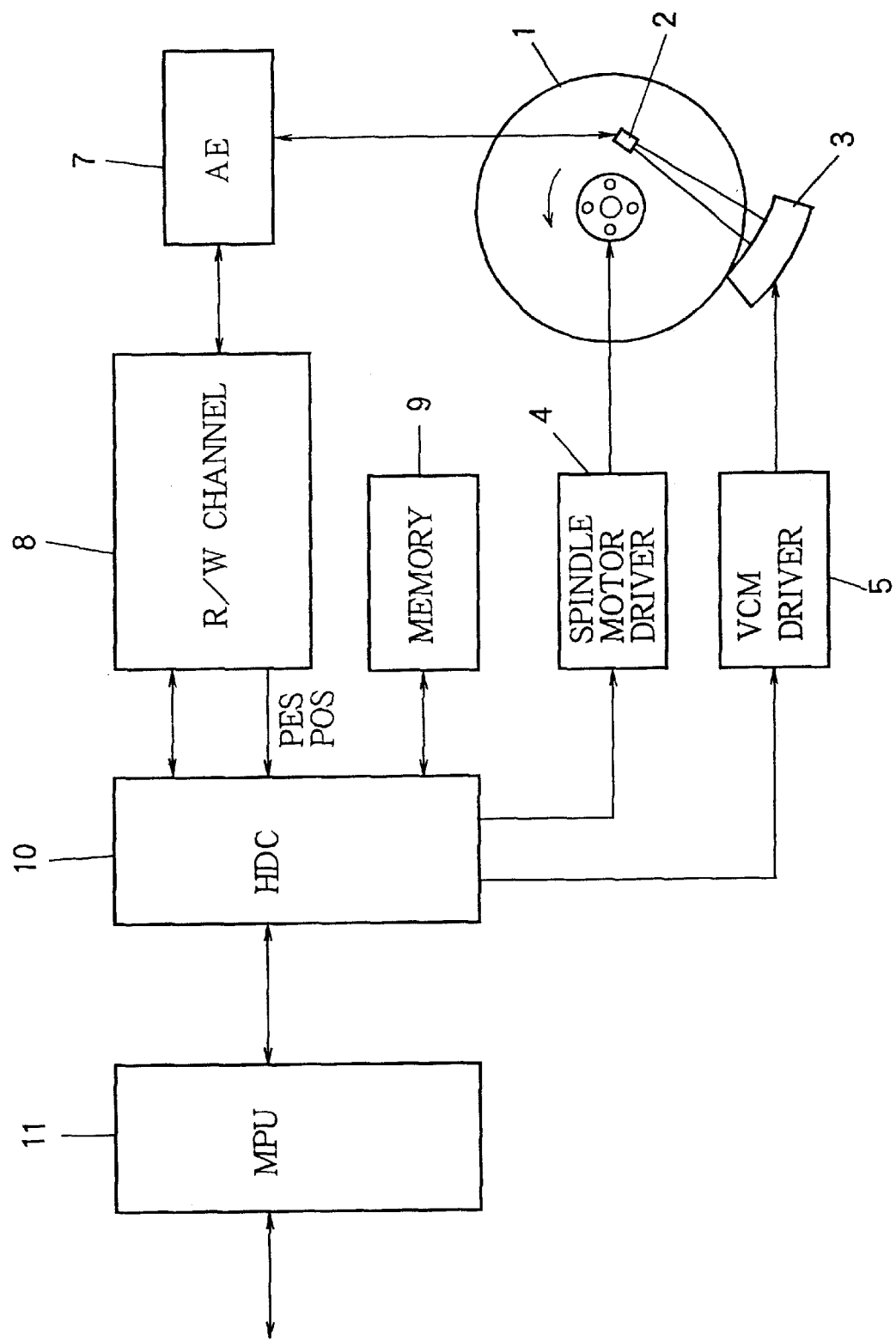
FIG. 1 is a block diagram showing the configuration of a disk drive apparatus according to an embodiment of the present invention.

FIG. 1 is a block diagram showing the structure of a disk drive apparatus according to an embodiment of the present invention. This disk drive magnetic recording apparatus comprises a magnetic disk 1 for recording data, a head 2 that carries out the reading and writing of tracks on the magnetic disk 1, a rotary actuator 3 that moves the head 2 in substantially the radial direction of the magnetic disk 1, a spindle motor driver 4 that controls the rotation of the magnetic disk 1, a voice coil motor driver (VCM driver) 5 that drives the rotary actuator 3, an arm electronics (AE) module 7 having circuits that, among other functions, amplify the read output of the head 2, a read/write (R/W) channel 8 that carries out the reading of servo sectors and the reading and writing of data, a memory 9 in which control programs, data, and the like are stored for controlling the operation of the entire disk drive apparatus, a hard disk controller (HDC) 10 that controls the entire apparatus, and a microprocessor unit (MPU) 11 that has a processor, memory, an interface to external apparatus, and the like, and controls communication with the external apparatus, such as the input and output of commands and data.

Figure 2:
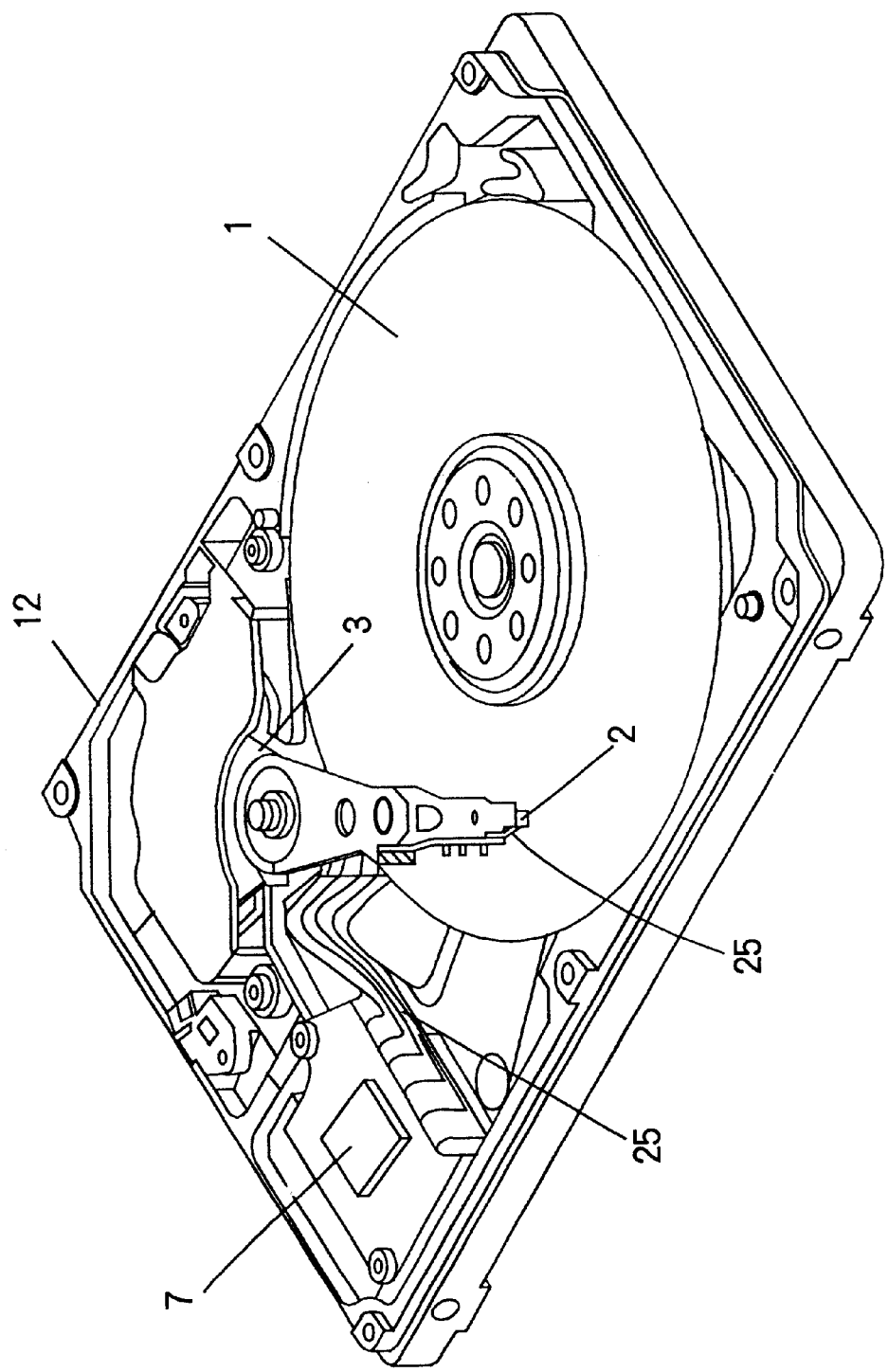
FIG. 2 is a perspective view showing the specific mounting of the disk drive apparatus.

FIG. 2 is a perspective view showing the specific mounting of this type of disk drive apparatus. The spindle motor driver 4, VCM driver 5, R/W channel 8, memory 9, HDC 10, and MPU 11, shown in FIG. 1, are mounted on a control card 20 (not visible) attached outside the chassis 12. The head 2 comprises a magnetic write head and a giant magnetoresistive (GMR) sensor, and is connected by a flexible cable 25 to the AE module 7. The read head is not restricted to a GMR head; for example, a conventional magnetoresistive (MR) head can also be employed. The AE module 7 and control card 20 are electrically coupled by the flexible cable 25 through the chassis 12.

Figure 3:
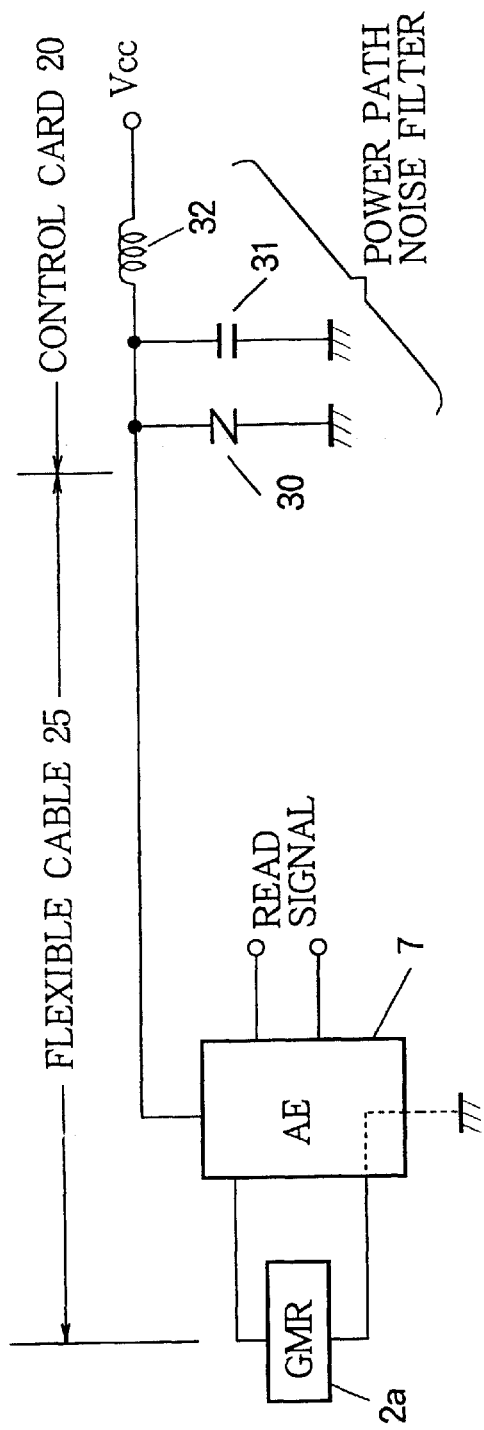
FIG. 3 is a block diagram of disk drive components including a preamplifier circuit apparatus according to an embodiment of the present invention.

FIG. 3 shows an implementation of one embodiment of the present invention comprising: a GMR read head 2a, the AE module 7, and part of control card 20. One end of the GMR head 2a is grounded through the AE module 7, which applies a bias voltage to the other end of GMR read head 2a. The AE module 7 operates on a power supply voltage (Vcc) supplied from the control card 20 or elsewhere through a power supply path in the flexible cable.

Figure 4A:
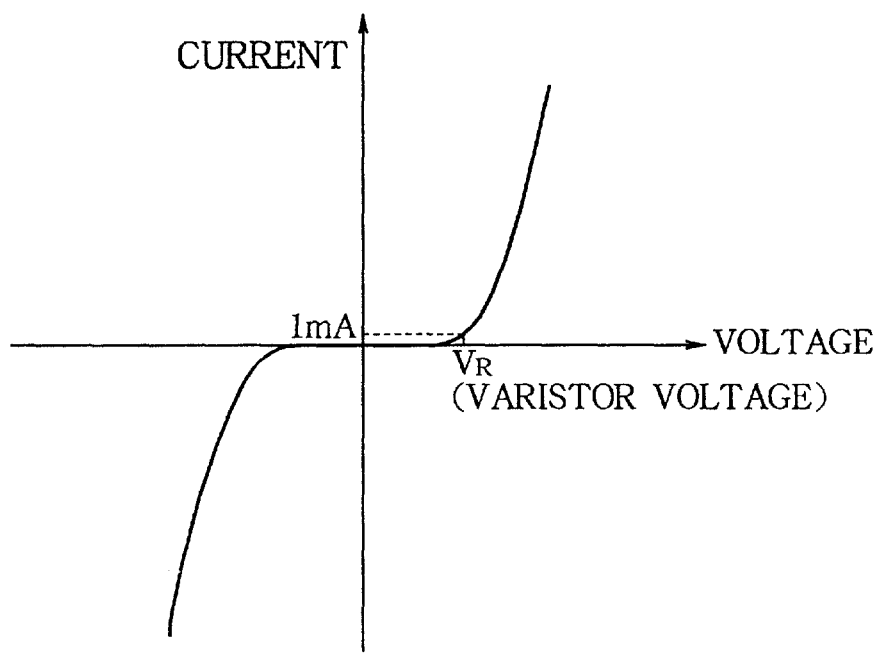
FIG. 4 is a diagram showing the voltage-current characteristics of a varistor.
Figure 4B:
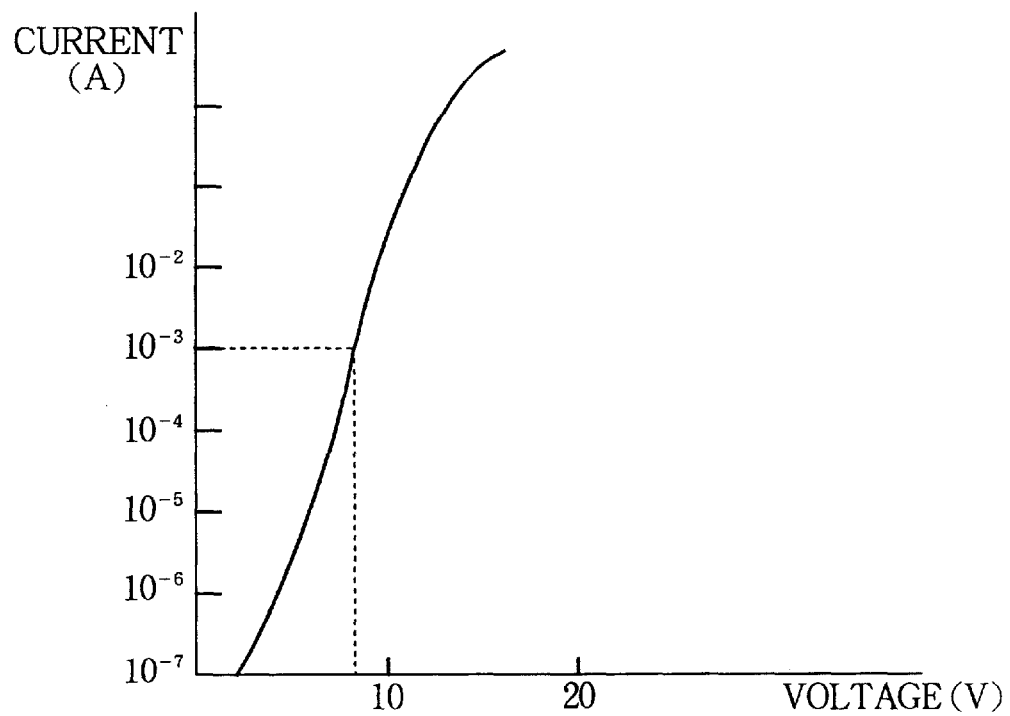

On the control card 20, a varistor 30 is provided between the power supply voltage line that provides the power supply voltage, and a ground terminal. This varistor 30 is a nonlinear conductive element having a voltage-current characteristic that current increases steeply when the voltage applied across the varistor exceeds a predetermined varistor voltage (expressed, for example, as the voltage at which the current is 1 mA). FIGS. 4(A) and 4(B) illustrate an example of this voltage-current characteristic. Varistors also differ from other nonlinear conductive elements such as diodes and zener diodes in having a voltage-current characteristic that is symmetrical with respect to the polarity of the applied voltage. Varistors also have a capacitive component due to the nonlinearity of the voltage-current characteristic.

In one embodiment with a power supply voltage Vcc of 5 V, for example, a varistor with a varistor voltage of approximately 8 V is used as the varistor 30. If the varistor voltage is too high, the effect of improved immunity to ESD is weakened, while if the varistor voltage is too low, allowing a large flow of current in the vicinity of the power supply voltage, this will likely cause heat and power dissipation problems. Thus it is advisable to select a varistor voltage that is higher than the upper limit of variability of the power supply voltage Vcc (higher than 5.5 V or 6 V, for example), but not an excessively high value.

A capacitor 31 is provided on the control card 20 in parallel with the varistor 30, and an inductor 32 is inserted in series in the power supply voltage line. As mentioned above, the varistor 30 has a capacitive component, so the capacitor 31, the inductor 32, and the capacitive component of the varistor 30 function as a low-pass filter (LPF), rejecting noise on the power supply line. High-frequency components in the power supply voltage supplied to the AE module 7 are thereby attenuated, which can contribute to the stable operation of the AE module 7. The capacitance of the varistor 30 has the apparent effect of increasing the capacitance of the capacitor 31, and can therefore make further contributions, e.g. by reducing the size of the capacitor 31.

If the GMR head 2a and magnetic disk 1 are at different potentials, discharges will occur between them during operation, creating much noise in the read output of the GMR head 2a. It is therefore advantageous to keep the head 2 and magnetic disk 1 at the same potential. To reproduce magnetic field changes faithfully, the output of the GMR head 2a is preferably brought out on a balanced path, for which purpose the potential of the GMR head must be a predetermined potential (for example, midway between the power supply voltage potential Vcc and the ground potential), and the potential of the magnetic disk 1 must be matched to this potential, making the power-supply system complicated and expensive. In economical disk drives, a single-ended configuration is generally used. One end of the GMR head 2a is grounded to, for example, the chassis 12, and the voltage of the other end is taken as the output, as shown in FIG. 3.

In embodiments with GMR head 2a in this single-ended configuration, because one end of GMR head 2a is grounded to the chassis 12, if the chassis 12 is raised to a high voltage by ESD during, for example, assembly this voltage is applied without alteration to one end of the GMR head 2a. If this voltage is discharged to the power supply voltage line through components such as the GMR head 2a and AE module 7, there is a risk that the operation of the GMR head 2a and AE module 7 may become defective. In disk drive apparatus according to one embodiment of the present invention, a varistor 30 is provided between the ground line and the power supply voltage line coupled to the AE module 7, as shown in FIG. 3. Accordingly, even if a high voltage is applied to the grounded side, as explained above, this voltage will be discharged to the power supply voltage line through the varistor 30, instead of the GMR head 2a and AE module 7, thereby protecting these components from ESD damage.

Regarding techniques directed to improvements in the ESD immunity of magnetoresistive sensors, there have been, for example, the approaches described in Unexamined Japanese Patent Application No. 169005/1995 (reference 1) and Unexamined Japanese Patent Application No. 45053/1996 (reference 2). Reference 1 describes inserting a protective element in parallel with the MR head, to protect the MR head if a high voltage is applied across the two ends of the MR head, by discharging this voltage through the protective element. Reference 2 describes using protective elements such as constant-voltage diodes or varistors between the layers of MR material constituting the MR head and the magnetic shield layers that are provided to enclose these layers of MR material, from which they are separated by insulating layers. If the voltage of the layers of MR material and the like exceeds a certain voltage, the voltage is discharged through these protective elements, so as to protect the head.

With the apparatus of references 1 and 2, however, since the varistors are disposed in parallel with the MR head, its high-frequency response is degraded by the capacitance of the varistors. Furthermore, with the apparatus described in reference 2, if the size of the head is reduced due to an increased recording density, the head becomes difficult to manufacture.

By contrast, in the present invention a varistor is provided between the power supply lines (the power supply voltage line and the ground line) of the AE module 7, so ESD immunity can be improved without degrading the high-frequency characteristics of the read output of the MR head. Furthermore, the protective element provided in the present invention is external to the GMR head 2a, so the GMR head 2a can be manufactured easily even if its size is reduced. ESD immunity can therefore be improved while costs are still held down.

Moreover, references 1 and 2 addressed only the protection of the head, and not the protection of the AE module. There is accordingly the risk that if the chassis 12 acquired a high voltage, for example, although the head would be protected, the voltage might discharge through the AE module. In contrast, in the present invention a varistor is inserted between the power supply line and ground line of the AE module 7. Hence if, for example, the chassis 12 acquires a high voltage, the voltage will discharge through the varistor and not through the GMR head 2a and AE module 7. AE module 7 and GMR head 2a are thereby protected from voltage discharge.

In the embodiment shown in FIG. 3, the varistor 30, capacitor 31, and inductor 32 are mounted on the control card 20. Alternatively, in another embodiment shown in FIG. 5, the varistor 30, capacitor 31, and inductor 32 are mounted on a flexible cable 25.

In embodiments with the varistor 30 mounted on the flexible cable 25, if a high voltage is accidentally applied to the power supply line during the manufacturing of the disk drive, the voltage will be discharged through varistor 30. This protects GMR head 2a and AE module 7 from ESD during the manufacturing process.

The present invention is not limited to the embodiments described above; in the embodiments above, for example, the invention was applied to a disk drive apparatus, but the invention can be widely implemented to improve the ESD immunity of measuring devices and other devices that use magnetoresistive sensors.

In addition to the varistor described above as the nonlinear conductive element, diodes, zener diodes, or other nonlinear conductive elements can also be employed, provided they discharge voltages higher than a predetermined voltage (the power supply voltage, for example), and function as protective elements.

Figure 5:
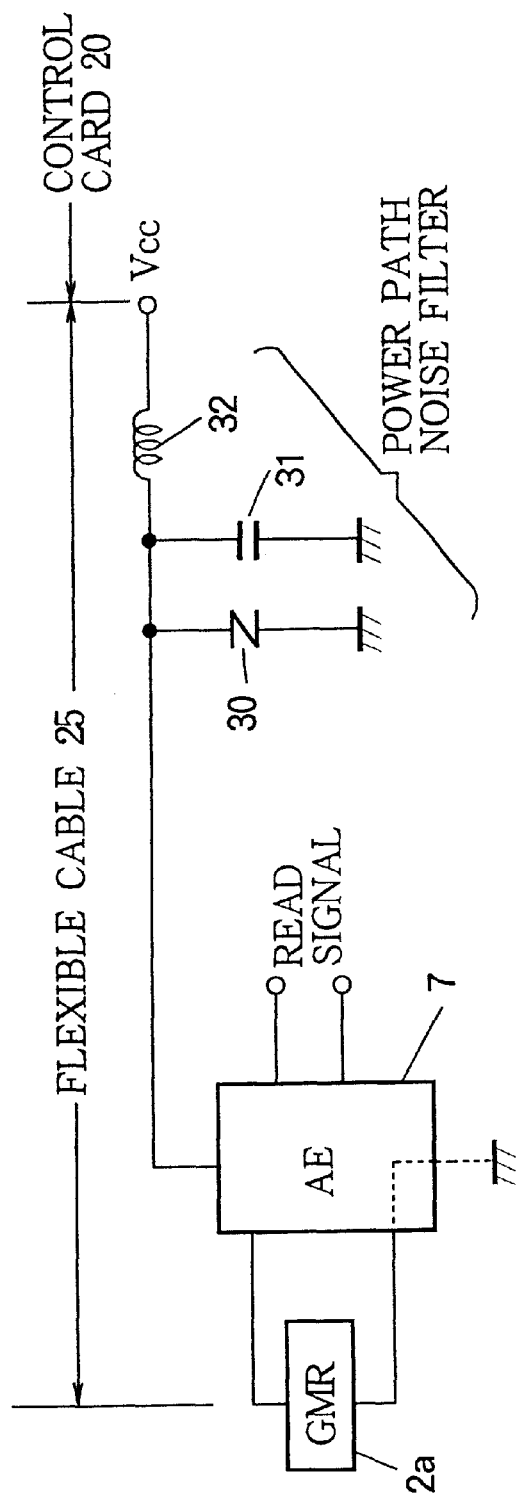
FIG. 5 is a block diagram of disk drive components including a preamplifier circuit apparatus according to a further embodiment of the present invention.

Also, a varistor 30, capacitor 31, and inductor 32 are provided in the embodiments above, as shown in FIGS. 3 and 5,; however, in an alternative embodiment inductor 32 is omitted. In a further alternative embodiment in which the purpose is only to improve ESD immunity, the varistor 30 alone is used, without including capacitor 31 or inductor 32.

When the grounded side of a magnetoresistive sensor and amplifier circuit is raised to a high voltage, the present invention discharges the high voltage through a nonlinear conductive element, instead of through the magnetoresistive sensor and amplifier circuit. The magnetoresistive sensor and amplifier circuit are thereby protected from destruction by ESD.

Since the present invention provides a nonlinear protective element between the ground potential and the power supply voltage supplied to the amplifier circuit, the high-frequency characteristics of the output of the magnetoresistive sensor are not degraded.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

We claim:

1. A preamplifier circuit, comprising:
   an amplifier circuit to amplify an output signal detected from a sensor, the amplifier circuit having a sensor input terminal and a sensor ground terminal for grounding a sensor;
   a power supply voltage line, coupled to the amplifier circuit, that provides a power supply voltage to the amplifier circuit;
   a nonlinear conductive element, coupled between a ground terminal and the power supply voltage line, to discharge voltages greater than a predetermined magnitude; and
   a filter circuit, coupled to the power supply voltage line, to reject high-frequency components of the power supply voltage supplied to the amplifier circuit.

2. The preamplifier circuit of claim 1 wherein the filter circuit further comprises a capacitor coupled between the ground terminal and the power supply voltage line.

3. The preamplifier circuit of claim 1
   wherein the amplifier circuit and the nonlinear conductive element are included on a single printed circuit.

4. The preamplifier circuit of claim 1 wherein the filter circuit further comprises an inductor coupled to the nonlinear conductive element.

5. A preamplifier circuit, comprising:
   an amplifier circuit to amplify an output signal detected from a sensor, the amplifier circuit having a sensor input terminal and a sensor ground terminal for grounding a sensor;
   a power supply voltage line, coupled to the amplifier circuit, that provides a power supply voltage to the amplifier circuit; and
   a nonlinear conductive element, coupled between a ground terminal and the power supply voltage line, to discharge voltages greater than a predetermined magnitude, wherein the nonlinear conductive element is a varistor.

6. A preamplifier circuit apparatus, comprising:
   an amplifier circuit to amplify an output signal detected from a magnetoresistive sensor, the amplifier circuit having a magnetoresistive sensor input terminal, and a magnetoresistive sensor ground terminal for grounding a magnetoresistive sensor;
   a flexible cable having a power supply voltage line, coupled to the amplifier circuit, for supplying a power supply voltage to the amplifier circuit;
   a nonlinear conductive element coupled to the flexible cable power supply voltage line and a ground terminal, to discharge voltage greater than a predetermined magnitude; and
   a filter circuit, coupled to the power supply voltage line, to reject high-frequency components of the power supply voltage supplied to the amplifier circuit.

7. The preamplifier circuit apparatus of claim 6 wherein the nonlinear conductive element is mounted on the flexible cable.

8. A magnetic recording apparatus, comprising:

a disk-shaped recording medium;

a head having a giant magnetoresistive (GMR) sensor that is grounded at one end;

an amplifier circuit to amplify an output signal detected from the magnetoresistive sensor;

a power supply voltage line, coupled to the amplifier circuit, for supplying power supply voltage to the amplifier circuit;

a nonlinear conductive element, coupled between a ground terminal and the power supply voltage line, to discharge voltages greater than a predetermined magnitude; and a data reproducing circuit for reproducing data from the magnetoresistive sensor output signal amplified by the amplifier circuit.

9. A magnetic recording apparatus, comprising:

a disk-shaped recording medium;

a head having a magnetoresistive sensor that is grounded at one end;

an amplifier circuit to amplify an output signal detected from the magnetoresistive sensor;

a power supply voltage line, coupled to the amplifier circuit, for supplying power supply voltage to the amplifier circuit;

a varistor, coupled between a ground terminal and the power supply voltage line, to discharge voltages greater than a predetermined magnitude; and a data reproducing circuit for reproducing data from the magnetoresistive sensor output signal amplified by the amplifier circuit.

10. An apparatus comprising:

a magnetoresistive sensor;

an amplifier circuit to amplify an output signal detected from the magnetoresistive sensor, the amplifier circuit having a sensor input terminal coupled to the magnetoresistive sensor and a sensor ground terminal coupled to the magnetoresistive sensor;

a power supply voltage line, coupled to the amplifier circuit, that provides a power supply voltage to the amplifier circuit;

a nonlinear conductive element, coupled between a ground terminal and the power supply voltage line, to discharge voltage greater than a predetermined magnitude; and a filter circuit, coupled to the power supply voltage line, to reject high-frequency components of the power supply voltage supplied to the amplifier circuit.

11. The apparatus of claim 10 wherein the filter circuit further comprises a capacitor coupled between the ground terminal and the power supply voltage line.

12. The apparatus of claim 10 wherein the amplifier circuit and the nonlinear conductive element are included on a single printed circuit.

13. The apparatus of claim 10, wherein the nonlinear conductive element is a varistor.

14. The apparatus of claim 10 wherein the filter circuit further comprises an inductor coupled to the nonlinear conductive element.

* * * * *